(12) United States Patent
Hudson

(10) Patent No.: US 9,735,020 B2
(45) Date of Patent: Aug. 15, 2017

(54) SYSTEM, METHOD AND APPARATUS FOR PLASMA ETCH HAVING INDEPENDENT CONTROL OF ION GENERATION AND DISSOCIATION OF PROCESS GAS

(71) Applicant: Lam Research Corporation, Fremont, CA (US)

(72) Inventor: Eric A. Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 101 days.

(21) Appl. No.: 14/924,572

(22) Filed: Oct. 27, 2015

(65) Prior Publication Data

US 2016/0049304 A1 Feb. 18, 2016

Related U.S. Application Data

(62) Division of application No. 12/713,523, filed on Feb. 26, 2010, now Pat. No. 9,190,289.

(51) Int. Cl.
*H01L 21/3065* (2006.01)
*H01L 21/311* (2006.01)
(Continued)

(52) U.S. Cl.
CPC .... *H01L 21/3065* (2013.01); *H01J 37/32532* (2013.01); *H01J 37/32596* (2013.01);
(Continued)

(58) Field of Classification Search
None
See application file for complete search history.

(56) References Cited

U.S. PATENT DOCUMENTS

| 4,276,557 A | 6/1981 | Levinstein et al. |
| 4,340,462 A | 7/1982 | Koch |

(Continued)

FOREIGN PATENT DOCUMENTS

| EP | 1155164 | 7/2010 |
| JP | 61-189642 | 8/1986 |

(Continued)

OTHER PUBLICATIONS

Koretzky, and Kuo, S.P.; Polytech, Univ., Farmingdale, NY, USA; Plasma Science, 1997 IEEE—Pub. Date May 19-22, 1997; p. 284.
(Continued)

*Primary Examiner* — Shamim Ahmed
(74) *Attorney, Agent, or Firm* — Martine Penilla Group, LLP

(57) ABSTRACT

A method of etching a wafer includes injecting a source gas mixture into a process chamber. The injecting includes injecting the source gas into multiple hollow cathode cavities in a top electrode, generating plasma in each of the cavities, and outputting the plasma from corresponding outlets of the cavities into a wafer processing region in the chamber, where the processing region is located between the outlets and a surface to be etched. An etchant gas mixture is injected into the processing region through injection ports in the top electrode such that the etchant gas mixes with the plasma output from the outlets. The etchant gas is prevented from flowing into the outlets of the cavities by the plasma flowing from the outlets. Mixing the etchant gas and the output from the cavities generates a desired chemical species in the processing region and thereby enables the surface to be etched.

19 Claims, 4 Drawing Sheets

(51) Int. Cl.
  *H01J 37/32* (2006.01)
  *H05H 1/24* (2006.01)
(52) U.S. Cl.
  CPC ... *H01L 21/31116* (2013.01); *H01J 37/32541* (2013.01); *H01J 2237/182* (2013.01); *H05H 1/24* (2013.01)

(56) References Cited

U.S. PATENT DOCUMENTS

| | | | |
|---|---|---|---|
| 5,108,778 A | 4/1992 | Susuki et al. | |
| 5,183,990 A | 2/1993 | Enyedy | |
| 5,302,237 A | 4/1994 | Larson et al. | |
| 5,349,271 A | 9/1994 | Van Os et al. | |
| 5,505,780 A | 4/1996 | Dalvie et al. | |
| 5,620,524 A | 4/1997 | Fan et al. | |
| 5,630,880 A | 5/1997 | Eastlund | |
| 5,904,780 A | 5/1999 | Tomoyasu | |
| 5,998,933 A | 12/1999 | Shun'ko | |
| 6,150,628 A | 11/2000 | Smith et al. | |
| 6,190,236 B1 | 2/2001 | Drill | |
| 6,335,293 B1 | 1/2002 | Luo et al. | |
| 6,337,460 B2 | 1/2002 | Kelkar et al. | |
| 6,388,226 B1 | 5/2002 | Smith et al. | |
| 6,392,351 B1 | 5/2002 | Shun'ko | |
| 6,432,260 B1 | 8/2002 | Mahoney et al. | |
| 6,444,137 B1 | 9/2002 | Collins et al. | |
| 6,527,911 B1 | 3/2003 | Yen et al. | |
| 6,641,698 B2 | 11/2003 | Kabansky | |
| 6,755,150 B2 | 6/2004 | Lai et al. | |
| 6,761,804 B2 | 7/2004 | Perrin | |
| 6,825,618 B2 | 11/2004 | Pu et al. | |
| 6,830,652 B1 | 12/2004 | Ohmi et al. | |
| 6,836,073 B2 | 12/2004 | Matsushita | |
| 6,851,384 B2 | 2/2005 | Yuda et al. | |
| 6,855,906 B2 | 2/2005 | Brailove | |
| 6,872,259 B2 | 3/2005 | Strang | |
| 6,924,455 B1 | 8/2005 | Chen et al. | |
| 6,936,546 B2 | 8/2005 | Robbins | |
| 6,962,644 B2 | 11/2005 | Paterson et al. | |
| 6,988,327 B2 | 1/2006 | Garcia et al. | |
| 7,069,937 B2 | 7/2006 | Garcia et al. | |
| 7,198,055 B2 | 4/2007 | Woods et al. | |
| 7,217,337 B2 | 5/2007 | Choi | |
| 7,234,477 B2 | 6/2007 | de Larios et al. | |
| 7,363,876 B2 | 4/2008 | Lai et al. | |
| 7,411,352 B2 | 8/2008 | Madocks | |
| 7,513,262 B2 | 4/2009 | Woods | |
| 7,645,495 B2 | 1/2010 | Dings et al. | |
| 7,785,672 B2 | 8/2010 | Choi et al. | |
| 7,895,970 B2 | 3/2011 | Honda et al. | |
| 8,056,503 B2 | 11/2011 | Kikuchi et al. | |
| 8,169,148 B2 | 5/2012 | Jeon et al. | |
| 8,999,104 B2 | 4/2015 | Shajii et al. | |
| 2001/0000104 A1 | 4/2001 | Li et al. | |
| 2001/0002582 A1 | 6/2001 | Dunham et al. | |
| 2001/0003271 A1 | 6/2001 | Otsuki | |
| 2001/0023741 A1 | 9/2001 | Collison et al. | |
| 2001/0047760 A1 | 12/2001 | Moslehi | |
| 2001/0051439 A1 | 12/2001 | Khan et al. | |
| 2002/0030167 A1 | 3/2002 | Liebert et al. | |
| 2002/0101167 A1 | 8/2002 | Shan et al. | |
| 2002/0104821 A1 | 8/2002 | Bazylenko et al. | |
| 2002/0121345 A1 | 9/2002 | Chen et al. | |
| 2003/0015965 A1 | 1/2003 | Godyak | |
| 2003/0071035 A1 | 4/2003 | Brailove | |
| 2003/0106647 A1 | 6/2003 | Koshiishi et al. | |
| 2003/0188685 A1 | 10/2003 | Wang et al. | |
| 2003/0213560 A1 | 11/2003 | Wang et al. | |
| 2004/0018320 A1 | 1/2004 | Nicolussi | |
| 2004/0027781 A1 | 2/2004 | Hanawa et al. | |
| 2004/0047720 A1 | 3/2004 | Lerner et al. | |
| 2004/0097090 A1* | 5/2004 | Mimura | H01J 37/32082 438/709 |
| 2004/0175953 A1 | 9/2004 | Ogle | |
| 2004/0231799 A1 | 11/2004 | Lee et al. | |
| 2004/0238123 A1 | 12/2004 | Becknell et al. | |
| 2004/0238124 A1 | 12/2004 | Nakamura | |
| 2005/0000655 A1 | 1/2005 | Wi | |
| 2005/0001556 A1 | 1/2005 | Hoffman et al. | |
| 2005/0103620 A1 | 5/2005 | Chistyakov | |
| 2005/0160985 A1 | 7/2005 | Brcka | |
| 2005/0184670 A1 | 8/2005 | Lacosta et al. | |
| 2005/0194100 A1 | 9/2005 | Or et al. | |
| 2006/0065623 A1 | 3/2006 | Guiney et al. | |
| 2006/0118517 A1* | 6/2006 | Ogawa | H01L 21/31144 216/67 |
| 2006/0236931 A1 | 10/2006 | Singh et al. | |
| 2006/0289409 A1 | 12/2006 | Choi et al. | |
| 2007/0017636 A1 | 1/2007 | Goto et al. | |
| 2007/0032081 A1 | 2/2007 | Chang et al. | |
| 2007/0081295 A1 | 4/2007 | Brillhart et al. | |
| 2007/0163440 A1 | 7/2007 | Km et al. | |
| 2007/0212484 A1 | 9/2007 | Li et al. | |
| 2007/0251642 A1 | 11/2007 | Bera et al. | |
| 2007/0277930 A1 | 12/2007 | Yokoyama et al. | |
| 2007/0289710 A1 | 12/2007 | Hudson et al. | |
| 2008/0020574 A1 | 1/2008 | Marakhtanov et al. | |
| 2008/0041820 A1 | 2/2008 | Tong et al. | |
| 2008/0099145 A1 | 5/2008 | Keller | |
| 2008/0110860 A1 | 5/2008 | Miller et al. | |
| 2008/0173237 A1 | 7/2008 | Collins et al. | |
| 2008/0179007 A1 | 7/2008 | Collins et al. | |
| 2008/0179546 A1 | 7/2008 | Lee et al. | |
| 2008/0286489 A1 | 11/2008 | Wang et al. | |
| 2008/0286697 A1 | 11/2008 | Verhaverbeke et al. | |
| 2008/0302652 A1 | 12/2008 | Entley et al. | |
| 2009/0015165 A1 | 1/2009 | Jeon et al. | |
| 2009/0025879 A1 | 1/2009 | Rauf et al. | |
| 2009/0061087 A1 | 3/2009 | Endo et al. | |
| 2009/0061542 A1 | 3/2009 | Patrick | |
| 2009/0066315 A1 | 3/2009 | Hu et al. | |
| 2009/0068849 A1 | 3/2009 | Endo et al. | |
| 2009/0109595 A1 | 4/2009 | Herchen et al. | |
| 2009/0197015 A1 | 8/2009 | Kudela et al. | |
| 2009/0200268 A1 | 8/2009 | Tappan et al. | |
| 2009/0200269 A1 | 8/2009 | Kadkhodayan et al. | |
| 2009/0218212 A1 | 9/2009 | Denpoh et al. | |
| 2009/0233384 A1 | 9/2009 | Foad et al. | |
| 2009/0242135 A1 | 10/2009 | Koshimizu et al. | |
| 2009/0250340 A1 | 10/2009 | Sasaki et al. | |
| 2009/0250443 A1 | 10/2009 | Kim | |
| 2009/0272492 A1 | 11/2009 | Katz et al. | |
| 2009/0275210 A1 | 11/2009 | Shanker et al. | |
| 2009/0277585 A1 | 11/2009 | Maebashi et al. | |
| 2009/0286333 A1 | 11/2009 | Kozasa et al. | |
| 2009/0286405 A1 | 11/2009 | Okesaku et al. | |
| 2009/0305509 A1 | 12/2009 | Stevenson et al. | |
| 2009/0321019 A1 | 12/2009 | Chen et al. | |
| 2009/0321249 A1 | 12/2009 | Chistyakov | |
| 2010/0008016 A1 | 1/2010 | Onate et al. | |
| 2010/0009542 A1* | 1/2010 | Honda | H01L 21/0212 438/702 |
| 2010/0024729 A1 | 2/2010 | Cao et al. | |
| 2010/0025371 A1 | 2/2010 | Cho et al. | |
| 2010/0065215 A1 | 3/2010 | Jeon et al. | |
| 2010/0072172 A1 | 3/2010 | Ui et al. | |
| 2010/0116788 A1 | 5/2010 | Singh et al. | |
| 2010/0116790 A1 | 5/2010 | Spitzl | |
| 2010/0140223 A1 | 6/2010 | Tyler et al. | |
| 2010/0147050 A1 | 6/2010 | Barth | |
| 2010/0319852 A1 | 12/2010 | Brillhart et al. | |
| 2011/0061687 A1 | 3/2011 | Mikhaylichenko et al. | |
| 2011/0075313 A1 | 3/2011 | Comendant | |
| 2011/0108524 A1 | 5/2011 | Dhindsa et al. | |
| 2011/0135843 A1 | 6/2011 | Niira et al. | |
| 2011/0209663 A1 | 9/2011 | Endo et al. | |
| 2012/0142197 A1 | 6/2012 | Endo et al. | |
| 2012/0238102 A1* | 9/2012 | Zhang | H01J 37/32422 438/718 |

(56) References Cited

U.S. PATENT DOCUMENTS

2013/0093443 A1    4/2013    Patrick

FOREIGN PATENT DOCUMENTS

| | | |
|---|---|---|
| JP | 64-004481 | 1/1989 |
| JP | 05-144594 | 6/1993 |
| JP | 05-166595 | 7/1993 |
| JP | 07-094483 | 4/1995 |
| JP | 07-183282 | 7/1995 |
| JP | 08-078192 | 3/1996 |
| JP | 2001-226775 | 8/2001 |
| JP | 2001-237226 | 8/2001 |
| JP | 2004-186532 | 7/2004 |
| JP | 2004-296729 | 10/2004 |
| JP | 2010-034532 | 2/2010 |
| KR | 10-0663668 | 1/2007 |
| KR | 10-2007-0079870 | 8/2007 |
| KR | 10-2010-0012436 | 2/2010 |
| RU | 2022917 | 11/1994 |
| RU | 2056702 | 3/1996 |
| RU | 2094961 | 10/1997 |
| WO | WO 01/36703 | 5/2001 |
| WO | 2010013746 | 2/2010 |
| WO | WO 2010013746 | 2/2010 |

OTHER PUBLICATIONS

Yamamoto, Tetsuya, et al.; Dept. of Electr. & Electron. Eng., Yamagata Univ. Yonezawa, Japan—Antennas and Propagation Society International Symposium, 2001, IEEE; Pub. Date: Jul. 8-13, 2001—vol. 3, pp. 712-715.

Definition of "Bias" from Dictionary.com, Retrieved from the Internet: <URL: http://dictionary.reference.com/browse/bias?s=t> [Retrieved on Nov. 3, 2012] (3 pgs).

PCT International Search Report—PCT/US2011/001175 dated Nov. 29, 2011.

PCT International Search Report—PCT/US2011/001174 dated Dec. 6, 2011.

PCT International Search Report—PCT/US2011/001176 dated Jan. 19, 2012.

PCT International Search Report—PCT/US2012/065333—dated Jan. 25, 2013.

PCT International Search Report—PCT/US2012/063987—dated Jan. 28, 2013.

PCT International Search Report—PCT/US2012/065080—dated Jan. 28, 2013.

PCT International Search Report—PCT/US2012/065684—dated Jan. 28, 2013.

PCT International Search Report—PCT/US2012/065949—dated Feb. 5, 2013.

PCT International Search Report—PCT/US2012/065677—dated Feb. 7, 2013.

PCT International Search Report—PCT/US2012/066467—dated Feb. 8, 2013.

PCT International Search Report—PCT/US2012/065122—dated Mar. 25, 2013.

English translation of Notice of Reasons for Rejection issued in Japanese Patent Application No. 2012-555013, dated Jan. 6, 2015 (4 pgs).

First Office Action issued in Korean Patent Application No. 10-2012-7022221, dated Dec. 2, 2016, with English translation of pertinent portion thereof (15 total pages).

* cited by examiner

SYSTEM, METHOD AND APPARATUS FOR PLASMA ETCH HAVING INDEPENDENT CONTROL OF ION GENERATION AND DISSOCIATION OF PROCESS GAS

CROSS-REFERENCE TO RELATED APPLICATION

This application is a divisional of U.S. patent application Ser. No. 12/713,523, filed Feb. 26, 2010, U.S. Pat. No. 9,190,289, the disclosure of which is incorporated herein by reference in its entirety for all purposes.

BACKGROUND

The present invention relates generally to plasma etch systems and methods, and more particularly, to systems and methods for plasma etch having independent control of ion generation and dissociation of process gas.

A simplified description of a typical plasma etching process is plasma chamber with a process gas therein. The process is excited by an RF or microwave signal electrically coupled into the process gas. Exciting the process gas causes ions and radicals to form within the process gas. The ions and radicals are then directed toward a surface to be etched. The ions and radicals can be directed toward the surface to be etched using gas flows and electrical biasing of various surfaces within the plasma chamber. The ions and radicals react with the material in the surface to be etched.

Increasing a density of an etching plasma is one method to increase how fast the etch surface is etched (e.g., etch rate, usually expressed in Angstroms per minute). Increasing the density of an etching plasma increases the concentration of the ions and thus increases the reactivity between the process gas, ions and the etch surface. However, increasing plasma density can also cause excess dissociation of the process gas mixture into constituent elements or molecules, beyond the level of dissociation which is optimal.

For example, increased plasma density typically causes atomic fluorine radicals to dissociate from a fluorocarbon process gas mixture. The dissociated fluorine may accelerate the undesirable etch of the etch mask, of the feature sidewall, or of the etch stop layer underlying the layer to be etched. Additionally, the excessive dissociation of fluorocarbon source gas may lead to non-optimal composition of fluorocarbon radical species in the plasma, with effects similar to excessive fluorine.

There are other issues of uniformity and control that are also reduced or less than desirable that can occur when the process gas is dissociated too much. In view of the foregoing, there is a need for systems and methods for plasma etch having independent control of ion generation and dissociation of process gas.

SUMMARY

Broadly speaking, the present invention fills these needs by providing systems and methods for plasma etch having independent control of ion generation and dissociation of process gas. It should be appreciated that the present invention can be implemented in numerous ways, including as a process, an apparatus, a system, computer readable media, or a device. Several inventive embodiments of the present invention are described below.

One embodiment provides a method of etching a semiconductor wafer including injecting a source gas mixture into a process chamber including injecting the source gas mixture into a multiple hollow cathode cavities in a top electrode of the process chamber and generating a plasma in each one of the hollow cathode cavities. Generating the plasma in the hollow cathode cavities includes applying a first biasing signal to the hollow cathode cavities. The generated plasma is output from corresponding outlets of each of the hollow cathode cavities into a wafer processing region in the process chamber. The wafer processing region is located between the outlets of the hollow cathode cavities and a surface to be etched. An etchant gas mixture is injected into the wafer processing region. The etchant gas mixture is injected through multiple injection ports in the top electrode such that the etchant gas mixture mixes with the plasma output from the outlets of the hollow cathode cavities. The etchant gas mixture is substantially prevented from flowing into the outlets of the hollow cathode cavities by the plasma and source gas mixture flowing from the outlets of hollow cathode cavities. Mixing the etchant gas mixture and the plasma generates a set of desired chemical species in the wafer processing region, leading to optimal etch results at the surface to be etched.

Generating plasma in each one of the hollow cathode cavities can include cooling the top electrode. Biasing the hollow cathode cavities can include applying the first biasing signal to a second conductive layer of the top electrode, the hollow cathode cavities being formed in the second conductive layer. The first biasing signal can include an RF biasing signal. The first biasing signal can include an RF signal within a range of between about 1 MHz and about 15 MHz.

The multiple injection ports can be substantially distributed across the wafer processing region surface of the top electrode. The hollow cathode cavities can be substantially distributed across the wafer processing region surface of the top electrode. The multiple hollow cathode cavities and the multiple injection ports can be substantially evenly interspersed across the wafer processing region surface of the top electrode.

Outputting the generated plasma from corresponding outlets of each of the hollow cathode cavities can include applying a second biasing signal to the lower electrode. Generating plasma in each one of the hollow cathode cavities can include applying a third bias signal to the outlets of the hollow cathode cavities. The third bias signal can be a ground potential.

Etching the surface to be etched can include applying a fourth bias signal to the wafer-supporting electrode or to another electrode coupled to the wafer processing region, to augment the plasma generation and wafer ion bombardment provided by the plasma flowing from the hollow cathode cavities.

Etching the surface to be etched can include removing etch byproducts from the wafer processing region. A ground potential can also be applied to a first conductive layer of the top electrode. The hollow cathode cavities can include multiple hollow cathode trenches. The multiple injection ports in the top electrode can include a multiple injection trenches. The source gas mixture can be an inert gas. The etchant gas mixture can include a fluorocarbon containing gas. The outlet for each one of the hollow cathode cavities can have width more than twice a plasma sheath thickness.

Another embodiment provides a system for generating an etching species including a source gas mixture source, an etchant gas source and a process chamber. The process chamber includes a top electrode and a bottom electrode. The top electrode includes multiple hollow cathode cavities, with the source gas mixture source coupled to an inlet of each one of the hollow cathode cavities. The top electrode also includes a first biasing signal source coupled to each one of the hollow cathode cavities and a corresponding outlet for each one of the hollow cathode cavities. The corresponding outlets open to a wafer processing region in the process chamber. The wafer processing region being located between the outlets of each of the hollow cathode cavities and a surface to be etched. The top electrode also includes multiple injection ports coupled to the etchant gas source. The injection ports are capable of injecting the etchant gas into the wafer processing region. The bottom electrode can support a semiconductor wafer, the semiconductor wafer including the surface to be etched.

Each one of the corresponding outlets can have a width greater than twice a plasma sheath thickness. Alternatively, each one of the corresponding outlets can have a width less than or equal to twice a plasma sheath thickness.

Another embodiment provides a method of etching a semiconductor wafer including injecting a source gas mixture into a process chamber including injecting the source gas mixture into multiple hollow cathode cavities in a top electrode of the process chamber, generating a plasma in each one of the hollow cathode cavities including applying a first biasing signal to the plurality of hollow cathode cavities, producing activated species in the hollow cathode cavities and outputting the produced activated species from corresponding outlets of each of the hollow cathode cavities into a wafer processing region in the process chamber. The wafer processing region being located between the outlets of each of the hollow cathode cavities and a surface to be etched. An etchant gas mixture is injected into the wafer processing region. A plasma is produced in the wafer processing region by coupling a second biasing signal to the wafer-supporting electrode or another electrode which is electrically coupled to the wafer processing region. The etchant gas mixture being injected through one or more injection ports in the top electrode such that the etchant gas mixture mixes with the activated species output from the outlets of the hollow cathode cavities and including generating a desired chemical species in the wafer processing region. The etchant gas mixture is substantially prevented from flowing into the outlets of each of the hollow cathode cavities by the activated species flowing from the outlets of each of the hollow cathode cavities. The outlet for each one of the hollow cathode cavities has a width of less than twice a plasma sheath thickness. The surface to be etched is then etched.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Figure 1:
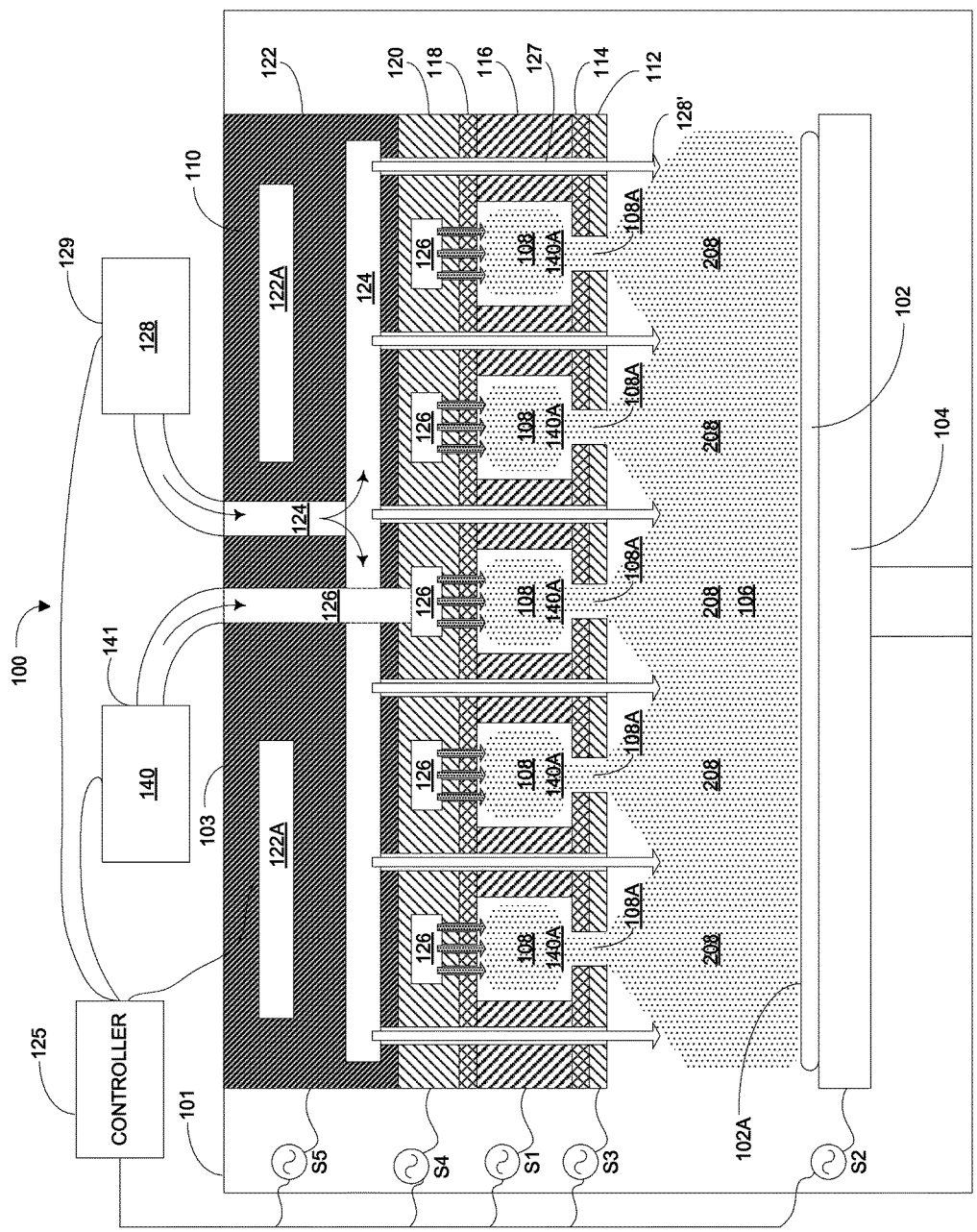
FIG. 1 is a schematic diagram of a plasma processing chamber system having multiple hollow cathode plasma cavities in the upper electrode, in accordance with embodiments of the present invention.

Several exemplary embodiments for systems and methods for plasma etch having independent control of ion generation and dissociation of process gas will now be described. It will be apparent to those skilled in the art that the present invention may be practiced without some or all of the specific details set forth herein.

Typical plasma chambers for etching dielectric wafer films have a common problem. Etch rate of the targeted material is often limited by the ion flux reaching the surface. To obtain higher etch rates, and thus a more efficient etch process, ion flux can be increased. As process control parameters are adjusted to produce relatively high ion flux to the wafer surface to be etched, the corresponding increase in plasma density leads to an increase in dissociation of the process gas(es). This changes the combination of chemical species present in the plasma. More specifically, the same parameter changes that increase the ion flux to the wafer generally also increase the electron density of the plasma. The electron density is a plasma condition which directly influences rates of molecular dissociation of the process gas(es) chemistry in the plasma, and thereby changes the chemical composition of the plasma (e.g., ratios between different radicals, process gas parent molecules, and etch byproducts). There is more dissociation as the plasma density increases causing corresponding changes in the overall plasma chemistry.

Fluorocarbon (or hydrofluorocarbon) source gases (FC gases) are typically used to etch $SiO_2$, $SiN_x$, $SiOCH_x$, and other silicon-based dielectrics. Excessive dissociation leads to unfavorable plasma conditions and less than optimal process results. Specifically, too much dissociation creates a plasma chemistry that is too "lean", meaning the tendency to etch surfaces is too strong and the tendency to passivate surfaces by forming fluorocarbon (FC) thin films is too weak. Too much dissociation converts polymerizing neutral species such as $C_xF_y$ (X=2, 3, 4) to etching neutral species such as $CF_x$ (X=1, 2, 3) and F resulting in reduced polymerization of the source gases on surfaces. The excess dissociation and the resulting low polymerization of the source gases causes low etch selectivity to mask and substrate films, as well as undesirable sidewall etching.

Adjusting the gas mixture in the plasma chemistry can sometimes at least partially compensate the excess dissociation. However, adjusting the gas mixture cannot completely overcome the low polymerization limitations of the high density plasma. An extreme example of this problem is seen when high-density inductively couple plasma (ICP) sources are used with FC gases. The result is a low selectivity to organic mask materials.

The close coupling between ion flux and electron density makes it difficult to obtain a plasma condition which combines a high ion flux and an optimal fluorocarbon plasma chemistry. This close coupling forces a tradeoff between a high etch rate and a high selectivity. This tradeoff is commonly encountered in high-aspect-ratio (HAR) contact or cell etching, where high etch rates are desirable due to the relatively thick films, and high selectivity is desired due to the cost and complexity of supplying thick mask films.

One approach to providing an increased plasma density without increased dissociation is to create a high density plasma but with a lower electron temperature as compared to typical conditions for HAR dielectric etch. This allows high ion fluxes to reach the wafer surface, but reduces the fraction of electrons with sufficient energy to induce dissociation of process gas. This can be achieved by spatially separating the plasma activation or generation from the process gas dissociation, in a way that allows uniform injection of both plasma and process gas into the wafer processing region. In this way, the plasma interacting with the substrate to be processed will have the benefit of low dissociation but high plasma density, because the plasma is generated or alternatively gases are preactivated in a region which is separated from the process gases.

One approach to increase plasma density without increase dissociation includes directly injecting plasma from the plasma source to the wafer processing region. The plasma density in the wafer processing region is provided and/or augmented by the injected plasma, such that the electron temperature and thus the process gas dissociation rate is not increased.

Another approach to increase plasma density without increase dissociation includes injecting activated species from the plasma source to the wafer region. These species may include metastable electronically excited atoms and molecules, vibrationally excited molecules, or radicals produced by molecular dissociation, such that these species have a substantially lower ionization energy than the parent atoms and molecules present in the source gas mixture. Plasma is produced in the wafer processing region by an electrical excitation which is distinct from the excitation of the plasma source. By way of example the lower electrode 104 can have an RF biasing signal S2 applied (e.g., 27 MHz) and the third conductive layer 112 of the top electrode can have a ground potential S3 applied. A portion of the activated species will be ionized by the plasma in the wafer processing region. Due to the reduced ionization potentials which characterize the activated species, relative to the unactivated source gas mixture, plasma equilibrium will be achieved with lowered electron energies, and therefore the plasma in the wafer processing region will adjust to a lower electron temperature. This lowered electron temperature will tend to produce less dissociation of the etchant gas mixture at the same plasma density, or same dissociation at higher plasma density. In both cases, the augmentation of the plasma density in the wafer processing region can be controlled by the power supplied to the plasma source(s), largely decoupled from the dissociation rate of process gas in the wafer processing region.

Figure 2:
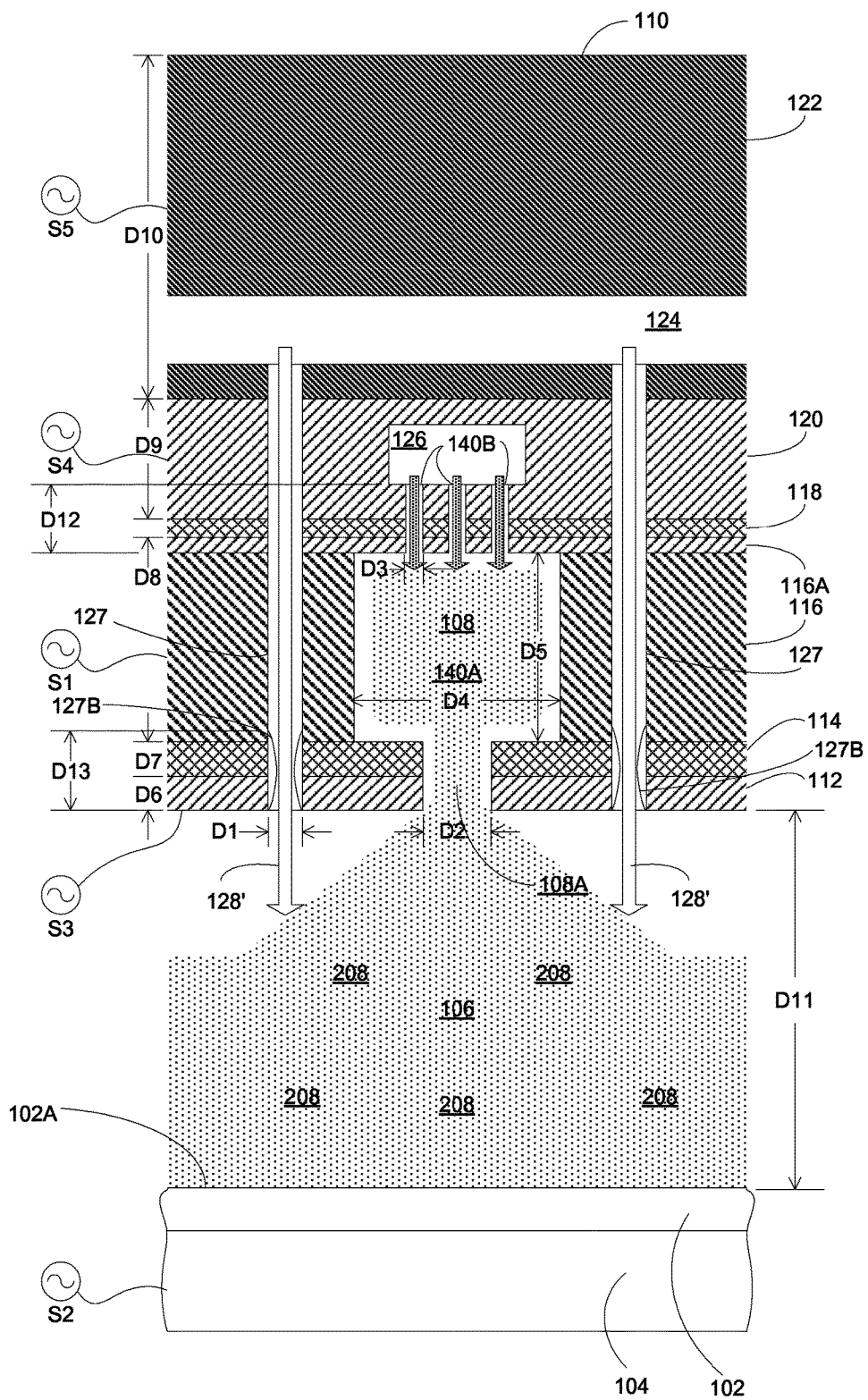
FIG. 2 is a more detailed view of a single one of multiple hollow cathode plasma cavities, in accordance with embodiments of the presenting invention.

FIG. 1 is a schematic diagram of a plasma processing chamber system 100 having multiple hollow cathode plasma cavities 108 in the upper electrode 103, in accordance with embodiments of the present invention. FIG. 2 is a more detailed view of a single one of multiple hollow cathode plasma cavities 108, in accordance with embodiments of the presenting invention. The system 100 includes a plasma processing chamber 101 and a controller 125. The plasma processing chamber 101 includes the upper electrode 103 and the lower electrode 104. The lower electrode 104 includes a chuck which supports and is electrically coupled to the wafer 102. The plasma processing chamber 101 also includes a wafer processing region 106 between the upper electrode 103 and the lower electrode 104. The wafer processing region can have a gap D11 of between about 16 mm and about 36 mm.

Multiple gas sources 129, 141 are coupled to the plasma processing chamber 101. Two gas sources 129, 141 are shown however more than two gas sources could also be included in or coupled to the system 100. The gas sources 129, 141 also include subsystems for controlling gas flowrate and mixing (e.g., valves, manifolds, flow monitors and flow controllers). The gas sources 129, 141 also include subsystems for controlling gas pressure the gases contained therein.

Multiple biasing (RF and/or DC) signal sources S1-S5 are also included in the system 100. The biasing signal sources S1-S5 are coupled to portions of the upper electrode 103 and lower electrode 104 as will be described in more detail below.

The upper electrode 103 includes a temperature control system 122A for controlling the temperature of the upper electrode. The upper electrode 103 also includes multiple hollow cathode plasma cavities 108. The upper electrode 103 also includes delivery plenums 124 and 126 for distributing the respective gases 128, 140 from the respective gas sources 129, 141 to respective points of use as described in more detail below.

The upper electrode 103 can be formed in multiple layers. By way of example a temperature control layer 122 can be a good thermal conductive material such as a metal (aluminum, stainless steel, other suitable thermally conductive material or combinations of materials), silicon carbide. The temperature control layer 122 has a thickness D10 of any suitable dimension. By way of example thickness D10 can be between less than about 3 mm and more than about 100 mm.

A first conductive layer 120 can be formed above the HC cavities 108. The first conductive layer 120 can be biased to assist in directing the plasma 140A formed in the HC cavities 108 as described in more detail below. The first conductive layer 120 has a thickness D9 of between about 3 mm and about 10 mm. An electrically insulating layer (not shown) can optionally be included between the temperature control layer 122 and the first conductive layer 120.

A second conductive layer 116 includes the HC cavities 108. As will be described in more detail below, forming the HC cavities 108 in a conductive layer allows a relatively simple structure for applying a biasing signal S1 to the HC cavities. A first insulating layer 118 electrically isolates the second conductive layer 116 from the first conductive layer 120. The first insulating layer 118 has a thickness D8 of between about 1 mm and about 6 mm.

A second insulating layer 114 electrically isolates the second conductive layer 116 from a third conductive layer 112. The second insulating layer 114 has a thickness D7 of between about 1 mm and about 6 mm. The third conductive layer 112 can be biased to assist in directing the plasma 140A formed in the HC cavities 108 as described in more detail below. The third conductive layer 112 has a thickness D6 of between about 3 mm and about 10 mm.

The controller 125 includes controller sub-systems including logic, software, processor(s), hardware, input/output subsystems, display subsystems, data storage systems, memory systems, communications and networking subsystems. The controller 125 includes a recipe that defines the desired operation of the plasma chamber system 100. The controller 125 is coupled to various sensor systems (e.g., electrical, optical, pressure, temperature, etc.) in the plasma processing system 100 to monitor the processing within the plasma processing system. The controller 125 is also coupled to control inputs and/or feedback outputs of the biasing signal sources S1-S5, the gas sources 129, 141, temperature control system 122A and to various actuators for moving (e.g., raising lowering, lateral movement, opening-closing, etc.) various components and, in some embodiment, the wafer 102 in the plasma processing system 100.

Figure 3:
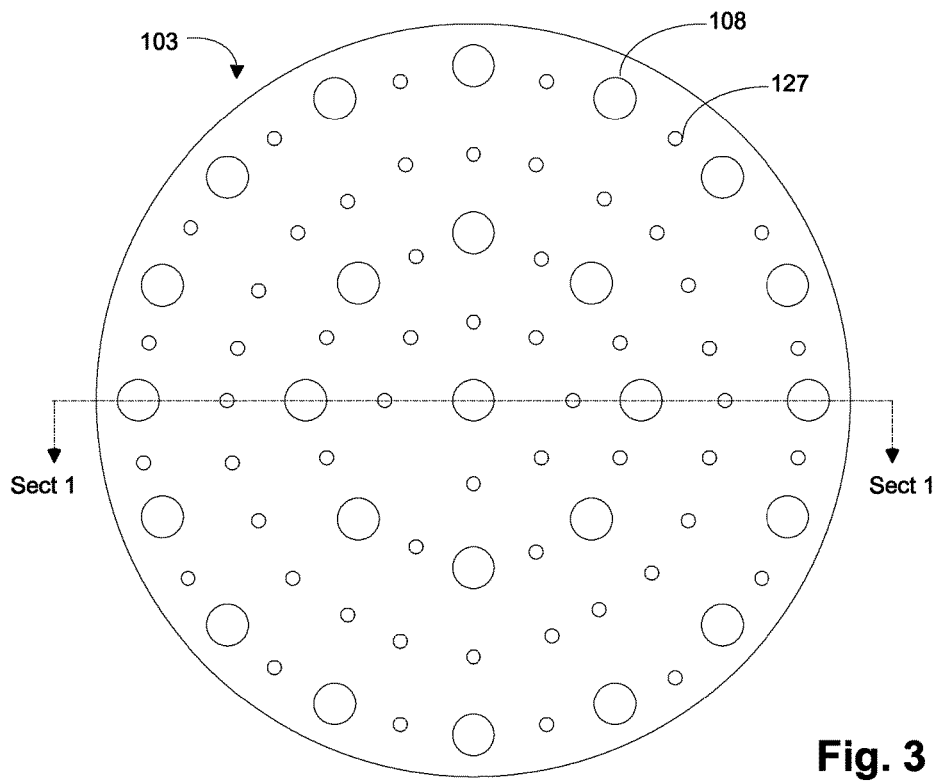
FIG. 3 is a schematic diagram of a two dimensional array of DC or RF-powered hollow cathode (HC) cavities in an upper electrode, in accordance with embodiments of the present invention.
Figure 4:
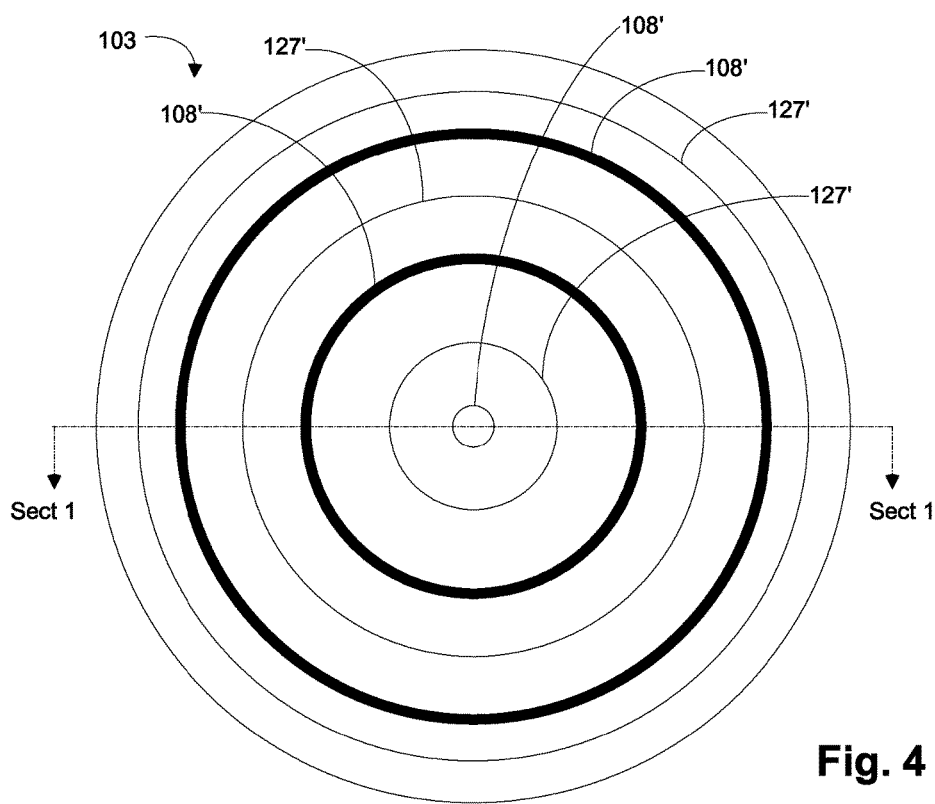
FIG. 4 is a schematic diagram of a two dimensional array of DC or RF-powered hollow cathode trenches in an upper electrode, in accordance with embodiments of the present invention.

FIG. 3 is a schematic diagram of a two dimensional array of DC or RF-powered hollow cathode (HC) cavities in an upper electrode 103, in accordance with embodiments of the present invention. FIG. 4 is a schematic diagram of a two dimensional array of DC or RF-powered hollow cathode trenches in an upper electrode 103, in accordance with embodiments of the present invention. FIGS. 1, 2 and 3 show multiple discrete HCs 108 and discrete injection ports 127 in the surface of the upper electrode 103. The embodiment shown in FIG. 4 replaces at least some of the discrete HCs 108 and discrete injection ports 127 with trenches 108' and 127', respectively, in the surface of the upper electrode 103. The trenches 108' and 127' can simplify manufacturing and assembly. It should be understood that the embodiments are shown in simplified, schematic form and are not necessarily drawn to scale.

The HC cavities 108 generate plasma via a hollow cathode effect where high energy electrons are trapped between the cathode walls. The HC cavity 108 has a width D4 of between about 3 mm and about 25 mm. The HC cavity 108 has a height D5 of between about 3 mm and about 25 mm.

The discrete HCs 108, discrete injection ports 127, and trenches 108' and 127' are shown substantially evenly distributed across the surface of the upper electrode 103. However, it should be understood that the distribution of the discrete HCs 108, discrete injection ports 127, and trenches 108' and 127' may not be as evenly distributed as shown. It should also be understood that the relative sizes of the discrete HCs 108, discrete injection ports 127, and trenches 108' and 127' may not be as illustrated in FIGS. 1-4.

Figure 5:
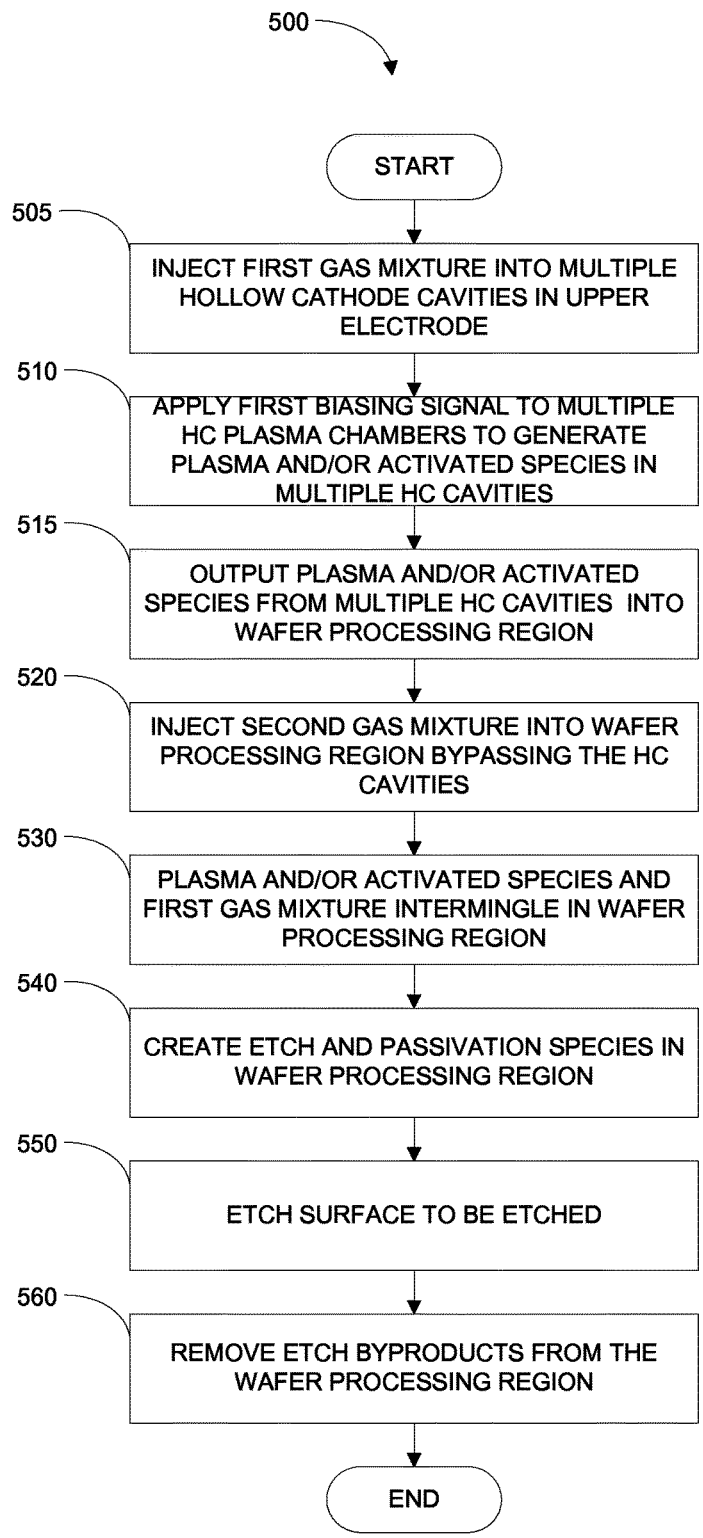
FIG. 5 is a flowchart diagram that illustrates the method operations performed in generating an increased plasma density without increased dissociation, in accordance with one embodiment of the present invention.

FIG. 5 is a flowchart diagram that illustrates the method operations 500 performed in generating an increased plasma density without increased dissociation, in accordance with one embodiment of the present invention. The operations illustrated herein are by way of example, as it should be understood that some operations may have sub-operations and in other instances, certain operations described herein may not be included in the illustrated operations. With this in mind, the method and operations 500 will now be described.

In an operation 505, the HC cavities 108 and/or trenches are supplied with a source gas 140 via distribution plenums 126. In an operation 510, a first signal S1 is applied to the HC cavities 108 to generate a plasma 140A and/or activated species therein. A high density plasma 140A can be produced at moderate pressures of between about 20 to about 5000 mT and more particularly at a pressure of between about 50 and 1000 mT. In an operation 515, the plasma 140A and/or activated species is delivered into a wafer processing region 106 located between the surface 102A to be etched and outlets 108A of the HC cavities 108.

The source gas 140 is supplied from the top of the HC cavities 108 to provide an optimal pressure in the HC cavities. The source gas 140 can be a pure gas or gas mixture of two or more gases. The source gas 140 is substantially inert and not reactive with the surface to be etched. By way of example the source gas(es) 140 can include one or a mixture of argon, xenon, or even a molecular gas such as N2 or O2. Although N2 and O2 are not normally considered inert, source gas may be considered as inert in this instance if the source gas, N2 and O2 and any dissociation thereof do not cause appreciable modification to the inner surfaces of the HC cavity 108 or trench, and do not include gases such as fluorocarbon gases which are intended to have low levels of dissociation.

Where activated species are injected into the wafer processing region 106, the source gas is selected to produce such desired species. For example, rare gas atoms such as argon and xenon are known to produce metastable electronically excited atoms under typical plasma conditions. These metastable atoms may have much lower ionization potentials than the ground-state atom. Likewise the N2 molecule is also relatively efficient at populating metastable electronic states under typical plasma conditions. As another example, CO molecule may also be beneficial, as it can dissociate in the source region to produce atomic C radicals which have a lower ionization potential than the CO molecule.

A fluorocarbon or other halide-containing etchant gas 128 is not considered inert, as may etch or form deposits on the inner surfaces of the HC cavity 108 and the surface 102A to be etched. A dissociation of a fluorocarbon or other halide-containing etchant gas 128 can also strongly affect etch results as described above. Therefore, the fluorocarbon or other halide-containing etchant gas 128 is not injected through the HC cavity 108. However, a fluorocarbon or other halide-containing etchant gas 128 is still needed for the etching/chemical reaction with the surface 102A to be etched.

The fluorocarbon or other halide-containing etchant gas 128 can also include a mixture of gases. Some gases in the etchant gas mixture may be inert and some gases in the mixture may be reactive. The ratios of the gases in the etchant gas mixture may be adjusted to achieve a desired ratio. Etchant gas 128 can be a single gas or a gas mixture which contains the chemical species or precursors thereof which act as chemical etchant at the surface to be etched 102A. By way of example, the etchant gas 128 can include fluorocarbons for SiO2 etch or Cl2 for Si etch. Other gases such as O2, CH4, or HBr may be mixed with the fluorocarbon containing gas(es), to provide sidewall passivation or other beneficial effects.

In an operation 520, a second gas including the fluorocarbon or other halide-containing etchant gas 128 is injected into the wafer processing region 106. The second gas bypasses the HC cavities 108 and is injected directly into the wafer processing region 106 via injection ports 127. The injection ports 127 are located between the outlets 108A of the HC cavities 108. Injecting the etchant gas 128 can include delivering the etchant gas from an etchant gas source 129 to one or more delivery plenums 124. The delivery plenums 124 distribute the etchant gas 128 to the injection ports 127. The etchant gas 108 is injected into the wafer processing region 106 from the injection ports 127. Thus, the fluorocarbon or other halide-containing etchant gas 128 bypasses the HC cavities 108 and is injected directly into the wafer processing region 106.

In an operation 530, the etchant gas 128 mixes with the plasma 140A and/or activated species output from the HC outlets 108A in the wafer processing region 106. When activated species are output from the HC outlets 108A, a plasma can be generated in the wafer processing region 106 bay applying a biasing signal S2 to the lower electrode 104 and a ground potential signal S3 to the third conductive layer 112 of the upper electrode. A combination of a selected flow rate of the source gas 140 and width D2 of the outlets 108A and vertical length D6+D7 of the outlets 108A determine a pressure drop as the plasma 140A and/or activated species flows from the outlet 108A of the HCs 108. Outlets 108A width D2 can be between about 1.0 mm and about 15 mm and the outlets 108A length D6+D7 can be between about 1.0 mm and about 12 mm. For gas flow through an aperture, the ratio of the net flow rate to the area represents the flux, and this parameter can be adjusted to determine the ability of the net gas flow to prevent undesirable gas transport in the opposite direction. The flux of gas 140 and plasma 140A through the outlets 108A substantially prevents gas species present in the wafer processing region 106 from entering the HCs 108 through the openings 108A. Thus, the etchant gas 128 and its dissociation and reaction products are substantially prevented from interacting with the surfaces inside HCs 108.

A combination of a selected flow rate of the source gas 140 and width D3 of the port(s) 140B and vertical length D12 of the port(s) 140B determine a pressure drop as the gas 140 flows into the HCs 108. The flux of gas 140 through the port(s) 140B and the width D3 substantially prevent plasma from extending into the source gas supply plenum 126. Port(s) 140B have a width D3 that is nominally less than about 2× the plasma sheath thickness. By way of example the width D3 can be between about 0.1 mm and about 0.7 mm. The aperture(s) 140B length D12 can be between about 1 mm and about 12 mm.

A combination of selected flow rate of the etchant gas 128 and width D1 and length D13 of the apertures 127B determine the pressure drop of the etchant gas 128 into the wafer processing region 106. Aperture 127B width D1 can be between about 0.3 mm and about 0.8 mm and the aperture length D13 can be between about 2.0 mm and about 20.0 mm. The flux of the etchant gas 128 and the width D1 of the apertures 127B substantially prevents gas species present in the wafer processing region 106 from entering the injection ports 127. The ratio of flow rates of the source gas 140 and the etchant gas 128 can be selectively controlled such as by varying the pressures of the respective gas sources 129, 141.

By way of example, the ratio of flow rates of the source gas 140 and the etchant gas 128 can be selectively controlled so that a larger portion of the total gas flow into the wafer processing region 106 is the source gas 140 and plasma ions 140A outlet from the HCs 108. Similarly, the ratio of flow rates of the source gas 140 and the etchant gas 128 can be selectively controlled so that a larger portion of the total gas flow into the wafer processing region 106 is outlet from the injection ports 127. Also similarly, the ratio of flow rates of the source gas 140 and the etchant gas 128 can be selectively controlled so that the total gas flow into the wafer processing region 106 is divided substantially evenly between the etchant gas 128 outlet from the injection ports 127 and the source gas 140 and plasma ions 140A outlet from the HCs 108.

The width D2 of the openings 108A of the HC cavities 108 substantially prevent the etchant gas 128 from flowing from the wafer processing region 106 and into the HC cavities. The width D2 is determined by a choice of plasma and/or activated species is desired to be output from the HCs 108, and by dynamics of the particular plasma 140A. By way of example, the width D2 is wider than twice a plasma sheath thickness so as to make sure the plasma is transported through the openings 108A and into the wafer processing region 106. Conversely, if only activated species and not plasma 140A is intended to be injected into the wafer processing region 106, then the width D2 would be made smaller than twice a plasma sheath thickness to ensure the plasma is extinguished in the openings 108A.

The HCs 108 and/or trenches 108' are distributed across the face of the upper electrode 103 so as to deliver a substantially uniform flow and mixture 208 of the etchant gas 127 and the plasma ions 140A across the wafer processing region 106 and to the surface 102A to be etched. In an operation 540, the electrons of the plasma 140A interact with the etchant gases 127, in the wafer processing region 106, to induce controlled dissociation and create the desired chemical species 208 needed for the etch reaction and associated passivation with the surface 102A. Due to remote nature of the plasma source(s) 108 and the diffusion of plasma 140A from the HCs 108 into the wafer processing region 106, or due to the transport of activated species with lowered ionization potentials from the HCs 108 into the wafer processing region 106, the electron temperature in the wafer processing region is significantly lower than the typical electron temperature currently typical for HAR dielectric etch.

In an operation 550, a portion of the plasma 140A and the desired chemical species 208 is delivered to the surface 102A to be etched which etches the surface to be etched. Etching the surface 102A generates etch byproducts. In an operation 560, the etch byproducts are removed from the wafer processing region 106. Delivering the plasma 140A and the desired chemical species 208 to the surface 102A to be etched also includes applying a signal from signal source S2 to the lower electrode 104. The signal S2 can be an RF bias to control ion bombardment energy. RF bias has a well known advantage over DC bias, RF bias can be applied through dielectric films with minimal potential drop (e.g. oxide films on the wafer surface or ceramic layers in the ESC). It should be understood that the signal S2 can include both RF and DC signals to bias the lower electrode 104. The bias signal S2 applied to lower electrode 104 may also produce and/or augment a plasma density in the wafer processing region 106.

Bias signals S3 and S4 can be provided to the respective top 120 and bottom 112 of the HC cavities 108 to improve the delivery of the plasma 140A from the HC cavities. The bias signals S3 and S4 can be a ground potential. The temperature control layer 122 can be biased with the same biasing signal S4 as the first conductive layer 120. Alternatively and as described above, an optional insulating layer can electrically isolate the temperature control layer 122 from the first conductive layer 120, thus allowing the temperature control layer to be biased with signal S5 that is different from the bias signal S4 applied to the first conductive layer.

The source gas 140 is injected into the top of the HC cavities 108 through one or more ports 140B having a width D3. The multiple small ports 140B substantially prevent the plasma 140A from leaking upward from the HC cavities 108 and into the delivery plenums 126. Conversely, the plasma injection at the outlet 108A of the HCs 108 is a single opening to allow plasma transport and/or active species transport with the minimum possible gas conductance.

In an exemplary embodiment, the signal S1 would be an RF in the 1-15 MHz range to avoid possible problems with DC-floating surface films on the electrode surfaces. The source gas 140 would be Argon and the etchant gas 128 would be a mixture of fluorocarbons, hydrofluorocarbons, and/or 02.

There are many alternative embodiments possible. By way of example, the cathode and ground signals S1, S3, S4 of the HC cavities 108, could be arranged such that the signal S1 could be applied to an optional conductive layer 116A that extends over the top of the HC cavities. Other variations are also possible in the gas feed geometry, since two separate gases 128, 140 are supplied to the wafer processing region 106 at substantially alternating points over the array.

The temperature control layer 122 can be actively cooled by the temperature control system 122A. Cooling the temperature control layer 122 will draw heat away from the HC cavities 108. By way of example, the temperature control layer 122 can include a coolant passing through the temperature control system 122A to carry the heat away from the upper electrode 103 to an external heat dissipation system (not shown). The temperature control system 122A can include other systems and methods of controlling the temperature of the upper electrode 103 as are well known in the art. By way of example the temperature control system 122A can include heat sinking, thermoelectric cooling, heating, and any suitable cooling media.

In one example where the etchant gas is composed of C4F8 and O2, the C4F8 molecule dissociates to form a variety of smaller atoms and molecules some of which are chemically reactive radicals. In particular, C2F4, C3F5, and other multicarbon species are partly responsible for polymerization processes which passivate the mask, sidewall, and stop layer through polymer deposition. In contrast, CF3 and F radical species act, in combination with ion bombardment, to etch the SiO2-based film to be etched. O radicals are produced by dissociation of O2. O radicals etch polymer, especially in combination with ion bombardment, thus allowing a controllable degree of net polymerization. By enabling a lower degree of dissociation than the typical processes, the present processes provide a greater ratio of passivant to etchant, which is more favorable for selective etching.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of etching a semiconductor wafer comprising:
    injecting a source gas mixture into a process chamber including:
        injecting the source gas mixture into a plurality of hollow cathode cavities in a top electrode of the process chamber;
        generating a plasma in each one of the plurality of hollow cathode cavities including applying a first biasing signal to the plurality of hollow cathode cavities; and
        outputting the generated plasma from corresponding outlets of each of the plurality of hollow cathode cavities into a wafer processing region in the process chamber, the wafer processing region being located between the outlets of each of the plurality of hollow cathode cavities and a surface of the semiconductor wafer to be etched;
    injecting a etchant gas mixture into the wafer processing region, the etchant gas mixture being injected through a plurality of injection ports in the top electrode such that the etchant gas mixture mixes with the plasma output from the outlets of the plurality of hollow cathode cavities including generating a desired chemical species in the wafer processing region and wherein the etchant gas mixture is prevented from flowing into the outlets of each of the plurality of hollow cathode cavities by the gas and the plasma flowing from the outlets of each of the plurality of hollow cathode cavities; and
    etching the surface using the plasma with the injected etchant gas mixture.

2. The method of claim 1, wherein generating plasma in each one of the plurality of hollow cathode cavities includes cooling the top electrode.

3. The method of claim 1, wherein biasing the plurality of hollow cathode cavities includes applying the first biasing signal to a second conductive layer of the top electrode, the plurality of hollow cathode cavities being formed in the second conductive layer.

4. The method of claim 1, wherein the first biasing signal includes an RF biasing signal.

5. The method of claim 1, wherein the first biasing signal including an RF signal within a range of between about 1 MHz and about 15 MHz.

6. The method of claim 1, wherein the plurality of injection ports are substantially distributed across the wafer processing region surface of the top electrode.

7. The method of claim 1, wherein the plurality of hollow cathode cavities are substantially distributed across the wafer processing region surface of the top electrode.

8. The method of claim 1, wherein the plurality of hollow cathode cavities and the plurality of injection ports are substantially evenly interspersed across the wafer processing region surface of the top electrode.

9. The method of claim 1, wherein outputting the generated plasma from corresponding outlets of each of the plurality of hollow cathode cavities includes applying a second biasing signal to the lower electrode.

10. The method of claim 1, wherein generating plasma in each one of the plurality of hollow cathode cavities includes applying a third bias signal to the outlets of the plurality of hollow cathode cavities.

11. The method of claim 1, wherein generating plasma in each one of the plurality of hollow cathode cavities includes applying a third bias signal to the outlets of the plurality of hollow cathode cavities, the third bias signal being a ground potential.

12. The method of claim 1, wherein etching the surface to be etched includes removing etch byproducts from the wafer processing region.

13. The method of claim 1, further comprising applying a ground potential to a first conductive layer of the top electrode.

14. The method of claim 1, wherein the plurality of hollow cathode cavities include a plurality of hollow cathode trenches.

15. The method of claim 1, wherein plurality of injection ports in the top electrode include a plurality of injection trenches.

16. The method of claim 1, wherein the source gas mixture is an inert gas.

17. The method of claim 1, wherein the etchant gas mixture includes a fluorocarbon containing gas.

18. The method of claim 1, wherein the outlet for each one of the plurality of hollow cathode cavities has a width of greater than twice a plasma sheath thickness.

19. A method of etching a semiconductor wafer comprising:
   injecting a source gas mixture into a process chamber including:
      injecting the source gas mixture into a plurality of hollow cathode cavities in a top electrode of the process chamber;
      generating a plasma in each one of the plurality of hollow cathode cavities including applying a first biasing signal to the plurality of hollow cathode cavities;
      producing activated species in the hollow cathode cavities; and
      outputting the produced activated species from corresponding outlets of each of the plurality of hollow cathode cavities into a wafer processing region in the process chamber, the wafer processing region being located between the outlets of each of the plurality of hollow cathode cavities and a surface of the semiconductor wafer to be etched;
   injecting an etchant gas mixture into the wafer processing region, the etchant gas mixture being injected through a plurality of injection ports in the top electrode such that the etchant gas mixture mixes with the activated species output from the outlets of the plurality of hollow cathode cavities including:
      generating a plasma in the wafer processing region; and
      generating a desired chemical species in the wafer processing region and wherein the etchant gas mixture is prevented from flowing into the outlets of each of the plurality of hollow cathode cavities by the activated species flowing from the outlets of each of the plurality of hollow cathode cavities, wherein the outlet for each one of the plurality of hollow cathode cavities as a width of less than twice a plasma sheath thickness; and
   etching the surface using the plasma with the injected etchant gas mixture.

* * * * *